United States Patent [19]
Sayama et al.

[11] Patent Number: 6,017,800
[45] Date of Patent: Jan. 25, 2000

[54] SEMICONDUCTOR DEVICE AND METHOD OF FABRICATING THEREOF

[75] Inventors: Hirokazu Sayama; Takashi Kuroi; Maiko Sakai; Katsuyuki Horita, all of Tokyo, Japan

[73] Assignee: Mitsubishi Denki Kabushiki Kaisha, Tokyo, Japan

[21] Appl. No.: 08/989,941

[22] Filed: Dec. 12, 1997

[30] Foreign Application Priority Data

Jul. 14, 1997 [JP] Japan .................................. P09-188286

[51] Int. Cl.[7] .......................... H01L 21/336; H01L 21/76
[52] U.S. Cl. ........................... 438/296; 438/424; 438/436
[58] Field of Search .................................. 438/436, 424, 438/296

[56] References Cited

U.S. PATENT DOCUMENTS

| | | |
|---|---|---|
| 5,677,233 | 10/1997 | Abiko . |
| 5,868,870 | 2/1999 | Fazan et al. . |
| 5,895,254 | 4/1999 | Huang et al. . |
| 5,911,109 | 6/1999 | Razouk et al. . |

FOREIGN PATENT DOCUMENTS

| | | |
|---|---|---|
| 5-343516 | 12/1993 | Japan . |
| 7-176604 | 7/1995 | Japan . |

OTHER PUBLICATIONS

A. Chatterjee, et al., IEDM, pp. 829–832, "A Shallow Trench Isolation Using Locos Edge for Preventing Corner Effects for 0.25/0.18 $\mu$m CMOS Technologies and Beyond", 1996.

*Primary Examiner*—Jey Tsai
*Assistant Examiner*—Josetta Jones
*Attorney, Agent, or Firm*—Oblon, Spivak, McClelland, Maier & Neustadt, P.C.

[57] ABSTRACT

An insulator (5) is a frame element for covering the outer edges of the active region (3), and protrudes upwardly above the surface of a semiconductor substrate (1) to constitute part of the inner walls of a trench (9) filled with an insulating film (2). A gate oxide film (21) is formed on the surface of the active region (3) adjacent the center thereof. The etching rate of the insulator (5) is lower than that of the insulating film (2). The insulator (5) prevents the sidewalls of the insulating film (2) from being etched away to suppress the formation of the depression positioned lower than the surface of the semiconductor substrate (1), thereby to alleviate influences upon an electric field adjacent the outer edges of the active region (3).

4 Claims, 13 Drawing Sheets

SEMICONDUCTOR DEVICE AND METHOD OF FABRICATING THEREOF

BACKGROUND OF THE INVENTION

1. Field of the Invention

The present invention relates to a method of fabricating a semiconductor device having a trench-type device isolation region.

2. Description of the Background Art

Completely independent control of a plurality of devices included in a semiconductor integrated circuit requires the elimination of electrical interference between the devices. To eliminate the electrical interference, it is necessary to form a device isolation region for defining an active region wherein each of the devices is formed.

An example of the methods of forming the device isolation region includes a well-known trench isolation technique. The trench isolation technique is such that a trench is formed in a semiconductor substrate and filled with an insulating film to form a device isolation region. The trench isolation technique provides few trench-type device isolation regions that encounter a problem known as a bird's beak, as compared with the LOCOS (local oxidation of silicon) technique, for example, which is one of the methods of forming the device isolation regions. Thus, the trench isolation technique is essential for size reduction of semiconductor integrated circuits.

FIG. 20 is a plan view of a background art semiconductor device. In FIG. 20, the reference numeral 20 designates a trench-type device isolation region; 3 designates active regions; and 4 designates gate electrode interconnect lines formed over the trench-type device isolation region 20 and the active regions 3. One MOS transistor is formed in each of the active regions 3.

A method of fabricating the background art semiconductor device is described below with reference to FIGS. 21 through 30. FIGS. 21 through 29 are cross-sectional views taken along the line 29—29 of FIG. 20. FIG. 30 is a cross-sectional view taken along the line 30—30 of FIG. 20.

First, a silicon oxide film 6 is formed on a surface of a semiconductor substrate 1, and a silicon nitride film 8 is formed on the silicon oxide film 6 (FIG. 21).

The silicon nitride film 8 and the silicon oxide film 6 are sequentially patterned using a photolithographic pattern as a mask to form a trench 9 extending from the top surface of the silicon nitride film 8 and having a bottom within the semiconductor substrate 1 (FIG. 22).

An inner wall oxide film 6a is formed on the inner wall of the trench 9 by thermal oxidation (FIG. 23).

An insulating film 2 of silicon oxide is formed over the top surface of the structure shown in FIG. 23 by the CVD process (FIG. 24).

Part of the insulating film 2 which is above the top surface of the silicon nitride film 8 is removed by the CMP process using the silicon nitride film 8 as a stopper so that the insulating film 2 is left only in the trench 9 (FIG. 25).

The silicon nitride film 8 is removed by etching using phosphoric acid at elevated temperatures. Then, an insulating film 2a of silicon oxide is deposited over the top surface of the resultant structure by the CVD process (FIG. 26).

The insulating film 2a is partially removed by anisotropic etching so that the insulating film 2a is left only on the sidewalls of the insulating film 2 above the surface of the silicon oxide film 6 (FIG. 27).

The silicon oxide film 6 is removed by etching using hydrofluoric acid (FIG. 28). The inner wall oxide film 6a and the insulating film 2 form the trench-type device isolation region 20. The top surface of the insulating film 2 is raised above the surface of the active regions 3.

A gate oxide film 21 is formed on the surface of the active region 3. Then, the gate electrode interconnect line 4 is formed over the trench-type device isolation region 20 and the gate oxide film 21 (FIGS. 29 and 30).

The background art semiconductor device, however, encounters problems to be described below with reference to FIGS. 27 and 28. The insulating film 2a is formed by deposition, and the silicon oxide film 6 is formed by thermal oxidation. In general, the etching rate of an oxide film formed by thermal oxidation is lower than that of an oxide film formed by the CVD process. Thus, prior to the removal of the entire silicon oxide film 6, the insulating film 2a is etched away, and the sidewalls of the insulating film 2 are subsequently etched away. This creates depressions 22 positioned lower than the surface of the active region 3 at the outer edges of the trench-type device isolation region 20.

The presence of the depressions 22 causes drawbacks to be described below. Referring to FIG. 30, an electric field adjacent the center of the gate oxide film 21 is determined only by an electric field extending between the gate electrode interconnect line 4 and the active region 3 through the gate oxide film 21. On the other hand, an electric field adjacent the ends of the gate oxide film 21 is determined by an electric field extending between the gate electrode interconnect line 4 and the active region 3 through the gate oxide film 21 and an electric field extending between the gate electrode interconnect line 4 and the active region 3 through the trench-type device isolation region 20. The reduced thickness of the trench-type device isolation region 20 at its outer edges by the amount of the depressions 22 increases the influence of the electric field extending between the gate electrode interconnect line 4 and the active region 3 through the trench-type device isolation region 20. Then, the electric field adjacent the ends of the gate oxide film 21 is stronger than the electric field adjacent the center of the gate oxide film 21. This causes an effect reverse to the narrow channel effect, that is, the decrease in transistor threshold level. Additionally, with reference to FIG. 27, the insulating film 2a shaped by anisotropic etching has varied configurations. The variations in the configuration of the insulating film 2a give rise to variations in the size of the depressions 22, resulting in variations in the transistor threshold level.

Further, with reference to FIG. 29, the gate electrode interconnect line 4, when formed, flows into the depressions 22. Then, the active region 3 and the gate electrode interconnect line 4 become closer to each other and, at the worst, are short-circuited.

As above described, the presence of the depressions 22 exerts adverse influences such as the decrease in transistor threshold level and the short-circuit of the active region 3 and gate electrode interconnect line 4.

SUMMARY OF THE INVENTION

A first aspect of the present invention is intended for a method of fabricating a semiconductor device. According to the present invention, the method comprises the steps of: (a) etching a trench extending from a surface of a semiconductor substrate and having a bottom in the semiconductor substrate to define an active region; (b) forming an insulator at an outer edge of the active region, the insulator protruding upwardly above the surface of the semiconductor substrate to extend part of an inner wall of the trench upwardly; (c) forming an insulating film over a top surface of a structure in which the trench is etched so as to fill at least the trench and protrude from the trench; and (d) etching away a top part of the insulating film after the step (b), wherein the etching rate of the insulator is lower than that of the insulating film in the step (d).

Preferably, according to a second aspect of the present invention, in the method of the first aspect, the step (a) comprises the steps of (a-1) forming a first oxide film on the surface of the semiconductor substrate by first thermal oxidation, (a-2) forming a semiconductor film on the first oxide film, and (a-3) forming a nitride film on the semiconductor film, the steps (a-1), (a-2), and (a-3) being performed before the trench is etched; the step (b) comprises the step of (b-1) performing second thermal oxidation after the trench is etched to a top surface of the semiconductor film, to form an oxide region thicker than the first oxide film; the step (c) comprises the steps of (c-1) depositing and forming a second oxide film serving as the insulating film over the top surface of the structure in which the trench is etched, (c-2) removing part of the insulating film which is above a top surface of the nitride film, and (c-3) removing the nitride film and the semiconductor film; and the oxide region includes the insulator.

Preferably, according to a third aspect of the present invention, in the method of the second aspect, the second thermal oxidation is performed when the trench is etched into the semiconductor film.

Preferably, according to a fourth aspect of the present invention, in the method of the second aspect, the thickness of the semiconductor film is greater than the thickness of the first oxide film.

According to a fifth aspect of the invention, a semiconductor device comprises: a semiconductor substrate; an insulating film having a bottom in the semiconductor substrate and a flat top protruding upwardly above a surface of the semiconductor substrate to define an active region; an insulator formed on a surface of the active region, covering an outer edge of the active region; and an interconnect line formed on the insulating film, wherein the top of the insulating film is level with a top of the insulator.

In accordance with the first aspect of the present invention, the insulator protruding upwardly above the surface of the semiconductor substrate to constitute the part of the inner wall of the trench and having an etching rate lower than that of the insulating film is formed at the outer edge of the active region prior to the start of the etching of the top part of the insulating film. This prevents the sidewall of the insulating film from being etched away, suppressing the formation of a depression in the insulating film which is positioned lower than the surface of the semiconductor substrate.

In accordance with the second aspect of the present invention, the first oxide film, the semiconductor film, and the nitride film are formed in stacked relation on the surface of the semiconductor substrate before the trench is etched. The second oxidation is performed after the trench is etched to the top surface of the semiconductor film and before the etching starts, to form the oxide region thicker than the first oxide film on the inner wall of the trench, that is, in a region including the outer edge of the active region. The first and second oxide films which are exposed are etched away at the same time after the removal of the nitride film and the semiconductor film. The etching rate of the oxide region formed by the second thermal oxidation is lower than that of the insulating film formed by deposition. Thus, the oxide region is left as the insulator when the part of the insulating film which is above the oxide region is completely etched away, preventing the sidewall of the insulating film from being etched away.

In accordance with the third aspect of the present invention, the second thermal oxidation is performed when the trench is etched into the semiconductor film to oxidize part of the semiconductor film which is immediately under the bottom of the trench to form part of the oxide region. Hence, it takes time for the oxidizing species to be supplied to the first oxide film. This precludes the oxidation from proceeding to reduce the length of the insulator along the surface of the semiconductor substrate, increasing the area of the active region.

In accordance with the fourth aspect of the present invention, since the thickness of the semiconductor film is greater than that of the first oxide film, the vertical distance between the first oxide film and the top of the insulator is greater than the thickness of the first oxide film. This prevents the insulator from being completely removed prior to the complete removal of the first oxide film in the step (d).

In accordance with the fifth aspect of the present invention, the electric field extending between the interconnect line and the active region becomes weak because of the presence of the insulator to exert less effect on the active region. Additionally, the interconnect line is provided without sensing a difference in level above the boundary between the insulator and the insulating film.

It is therefore an object of the present invention to provide a semiconductor device and a method of fabricating thereof which prevents the formation of a depression positioned lower than the surface of an active region at the outer edge of a device isolation region.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
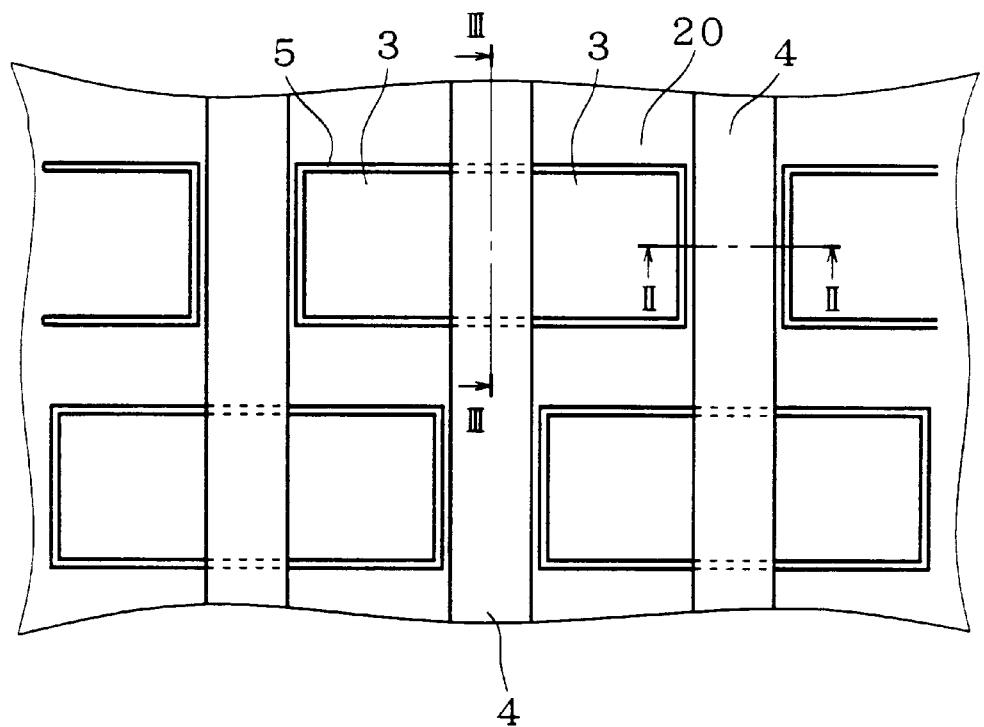
FIG. 1 is a plan view of a semiconductor device according to a first preferred embodiment of the present invention.
Figure 2:
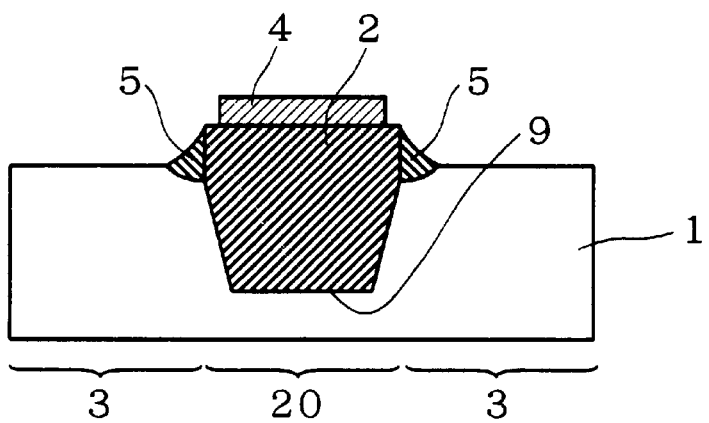
FIGS. 2 and 3 are cross-sectional views of the semiconductor device of the first preferred embodiment.
Figure 3:
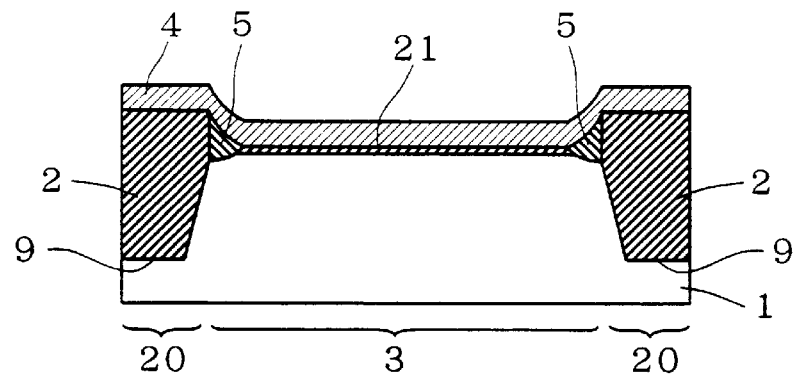

FIG. 1 is a plan view of a semiconductor device according to a first preferred embodiment of the present invention. FIG. 2 is a cross-sectional view taken along the line II—II of FIG. 1, and FIG. 3 is a cross-sectional view taken along the line III—III of FIG. 1. In FIGS. 1 through 3, the reference numeral 20 designates a trench-type device isolation region; 2 designates an insulating film of silicon oxide (second oxide film); 3 designates active regions; 4 designates gate electrode interconnect lines formed over the trench-type device isolation region 20 and the active regions 3; 5 designates insulators of silicon oxide formed at the outer edges of the active regions 3; 9 designates a trench filled with the insulating film 2; and 21 designates a gate oxide film.

Referring to FIGS. 1 through 3, a structure of the semiconductor device of the first preferred embodiment is described hereinafter. One MOS transistor is formed within each of the active regions 3. The trench 9 for defining the active regions 3 is formed in the surface of a semiconductor substrate 1. The insulators 5 are formed on the surface of the active regions 3 at the outer edges of the active regions 3, respectively. Each of the insulators 5 is a frame element for covering the outer edges of the associated active region 3, and protrudes upwardly above the surface of the semiconductor substrate 1 to extend parts of the inner walls of the trench 9 upwardly. The trench 9 is filled with the insulating film 2. The gate oxide film 21 is formed on the surface of the active region 3 adjacent the center of the active region 3. The gate electrode interconnect lines 4 are formed extending over the surfaces of the trench-type device isolation region 20 and the gate oxide film 21. The top surface of the insulating film 2 is raised above the surface of the active region 3.

The insulator 5 is of generally triangular cross-sectional configuration such that one side thereof is in contact with the insulating film 2, the vertex opposite to the one side is positioned on the exposed surface of the active region 3, and the other two sides thereof smoothly extend from the insulating film 2 toward the active region 3. That is, the insulator 5 is shaped like a bird's beak in cross section. The top of the insulating film 2 is level with the top of the insulator 5.

The first preferred embodiment produces effects to be described below.

In the process steps of the fabrication of the semiconductor device, the insulating film 2 is formed by deposition using the CVD process, and the insulator 5 is formed by thermal oxidation. Then, the etching rate of the insulator 5 is lower than that of the insulating film 2. Therefore, the insulator 5 prevents the sidewalls of the insulating film 2 from being etched away.

Figure 29:
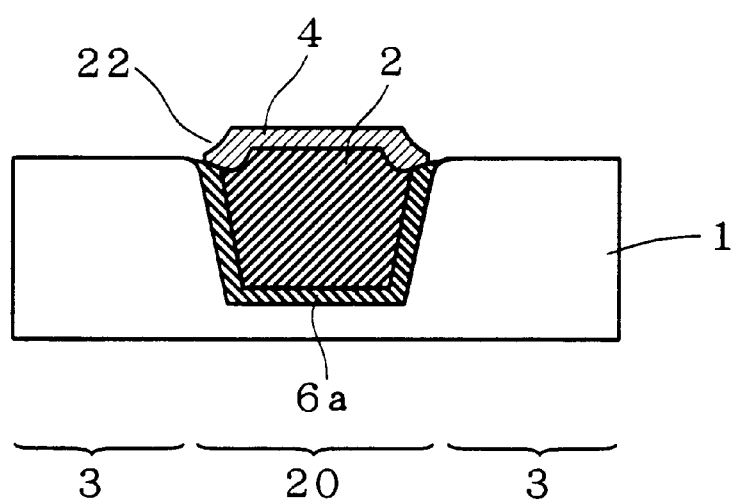
FIGS. 29 and 30 are cross-sectional views of the background art semiconductor device.

In the background art semiconductor device shown in FIG. 29, the removal of the sidewalls of the insulating film 2 by etching creates the depressions 22 positioned lower than the surface of the active region 3 at the outer edges of the trench-type device isolation region 20. In the first preferred embodiment of the present invention shown in FIG. 2, on the other hand, the insulator 5 prevents the sidewalls of the insulating film 2 from being etched away, suppressing the formation of the depressions 22.

Figure 30:
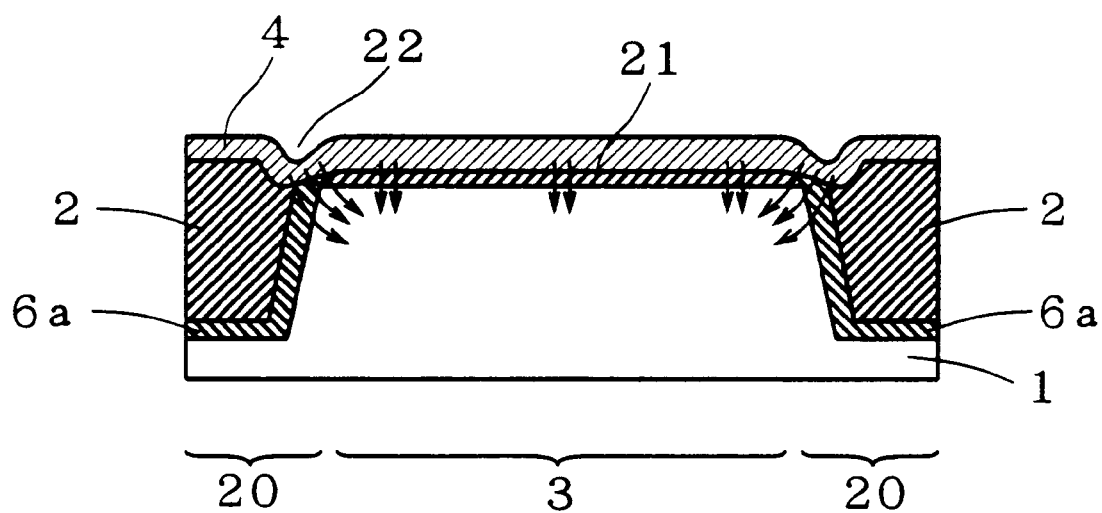

In the background art semiconductor device shown in FIG. 30, the removal of the sidewalls of the insulating film 2 by etching causes the reduced thickness of the inner wall oxide film 6a adjacent the boundary between the active region 3 and the trench-type device isolation region 20. In the first preferred embodiment shown in FIG. 3, on the other hand, the absence of the depressions 22 and the formation of the insulator 5 allow the sufficient thickness of the section corresponding to the background art inner wall oxide film 6a adjacent the boundary between the active region 3 and the trench-type device isolation region 20. The electric field becomes weak/strong as the thickness of the section lying between the gate electrode interconnect line 4 and the active region 3 increases/decreases. Thus, the electric field extending between the gate electrode interconnect line 4 and the active region 3 through the trench-type device isolation region 20 in the first preferred embodiment is weaker than that of the background art because of the presence of the thick insulator 5 to exert less effect on the electric field adjacent the ends of the gate oxide film 21. Therefore, the first preferred embodiment suppresses the decrease in transistor threshold level due to the electric field extending between the gate electrode interconnect line 4 and the active region 3 through the trench-type device isolation region 20.

The cross-sectional configuration of the insulator 5 alleviates the stresses between the semiconductor substrate 1 and the insulator 5 which result from the thermal expansion of the semiconductor substrate 1, the insulating film 2, and the insulator 5.

Additionally, since the top of the insulating film 2 is level with the top of the insulator 5, the gate electrode interconnect line 4 is provided without sensing a difference in level at the ends of the trench 9, as shown in FIG. 3.

Second Preferred Embodiment

A method of fabricating the semiconductor device of the first preferred embodiment will be described according to a second preferred embodiment of the present invention with reference to FIGS. 4 through 11. FIGS. 4 through 11 are cross-sectional views taken along the line II—II of FIG. 1.

First, a silicon oxide film 6 (first oxide film) having a thickness of about 5 to 30 nm is formed on a surface of the semiconductor substrate 1 by first thermal oxidation. Then, a semiconductor film 7 of non-single crystalline silicon (polycrystalline silicon or amorphous silicon) having a thickness of about 30 to 100 nm is formed on the silicon oxide film 6. A silicon nitride film 8 having a thickness of about 100 to 300 nm is formed on the semiconductor film 7 (FIG. 4).

Figure 4:
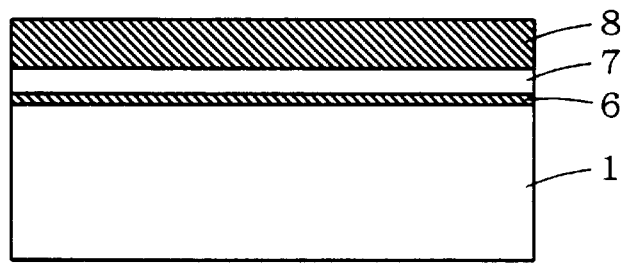
FIGS. 4 through 11 illustrate a method of fabricating the semiconductor device of the first preferred embodiment.
Figure 5:
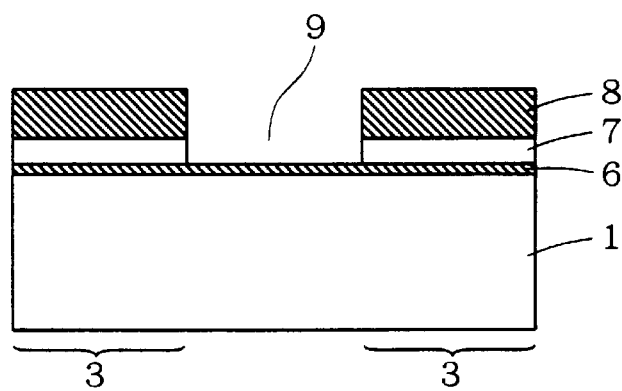
Figure 6:
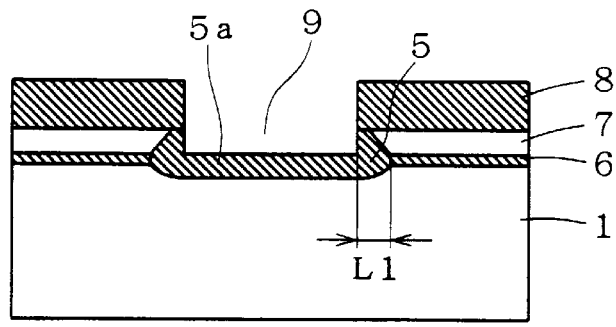

Next, the trench 9 is anisotropically etched from the top surface of the structure shown in FIG. 4 toward the semiconductor substrate 1. The etching of the trench 9 is temporarily stopped when the top surface of the silicon oxide film 6 is exposed (FIG. 5). Then, second thermal oxidation is performed on the inner walls of the trench 9 so that the sidewalls of the semiconductor film 7 exposed to the trench 9 and parts of the silicon oxide film 6 and semiconductor substrate 1 which are positioned immediately under the bottom of the trench 9 are oxidized to form an oxide region 5a (FIG. 6).

Figure 7:
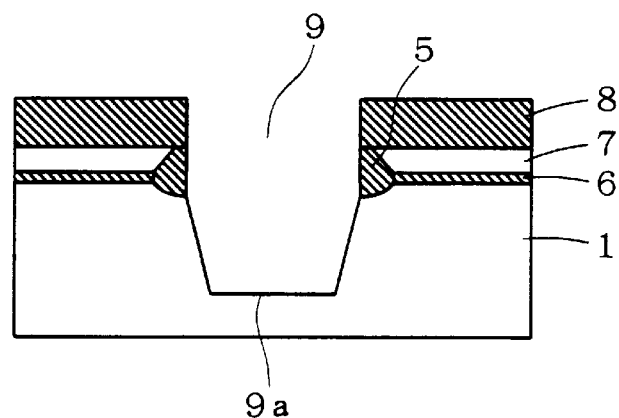

The trench 9 is further anisotropically etched again until the depth of the trench 9 from the interface between the semiconductor substrate 1 and the oxide film 6 to the bottom of the trench 9 in the semiconductor substrate 1 is about 100 to 500 nm (FIG. 7).

The trench 9 extending from the top surface of the structure shown in FIGS. 4 through 7 and having a bottom 9a in the semiconductor substrate 1 is etched to define the active region 3 (step (a)). The insulator 5 protrudes upwardly above the surface of the semiconductor substrate 1 at the outer edges of the active region 3 so as to extend parts of the inner walls of the trench 9 upwardly (step (b)). The oxide region 5a includes the insulator 5.

Figure 8:
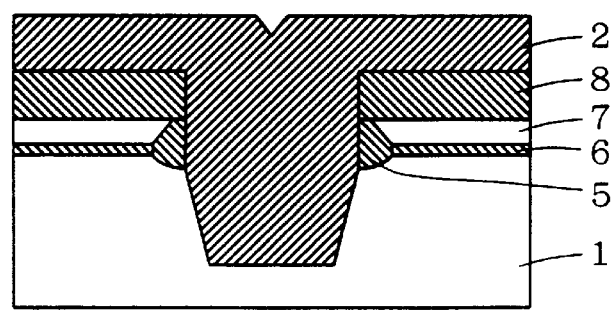

Next, the insulating film 2 of silicon oxide is deposited and formed over the top surface of the structure shown in FIG. 7 by the CVD process (FIG. 8).

Figure 9:
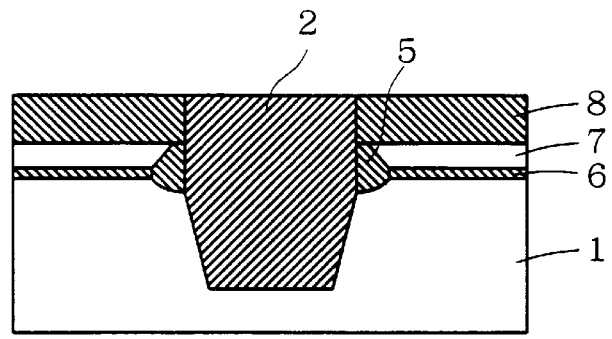

Part of the insulating film 2 which is above the top surface of the silicon nitride film 8 is removed by the CMP process using the silicon nitride film 8 as a stopper (FIG. 9).

Figure 10:
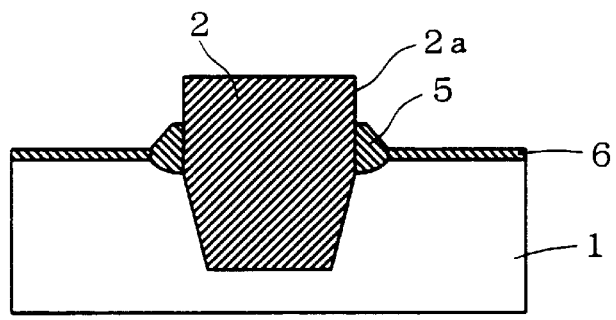

The silicon nitride film 8 is removed by etching using phosphoric acid at elevated temperatures. Thereafter, the semiconductor film 7 is removed by dry etching. Thus, part of the insulating film 2 which is above the insulator 5 is left unremoved (step (c); FIG. 10).

Figure 11:
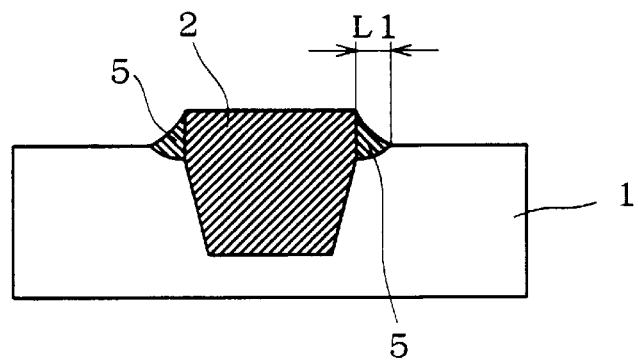
Figure 12:
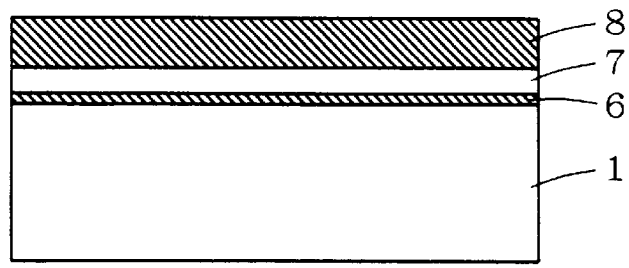
FIGS. 12 through 19 illustrate the method of fabricating the semiconductor device according to a second preferred embodiment of the present invention.

The silicon oxide film 6 and a top part 2a of the insulating film 2 which is above the insulator 5 are removed at the same time by wet etching using hydrofluoric acid. This provides the trench-type device isolation region 20 including the insulating film 2 and the insulator 5. (step (d); FIG. 11).

As illustrated in FIGS. 9 through 11, the removal of the part of the insulating film 2 which is positioned outside the trench 9, the silicon oxide film 6, and the semiconductor film 7 by using etching allows the semiconductor substrate 1 in the active region 3 to be exposed.

The gate oxide film 21 and the gate electrode interconnect line 4 are formed. Then, a transistor shown in FIGS. 1 through 3 is completed.

The insulating film 2 is formed by deposition using the CVD process. The insulator 5 is formed by the second thermal oxidation. The etching rate of the insulator 5 is lower than that of the insulating film 2, so that the top of the insulator 5 is to be level with the top of the insulating film 2 by etching (FIGS. 10 and 11).

The second preferred embodiment produces effects to be described below.

The use of the method of fabricating the semiconductor device of the second preferred embodiment may produce the semiconductor device which comprises the insulating film 2 having a top surface raised above the surface of the active region 3.

In the second preferred embodiment illustrated in FIGS. 10 and 11, the wet etching using hydrofluoric acid removes the silicon oxide film 6 and the part of the insulating film 2 which is above the insulator 5 at the same time. Since the etching rate of the insulator 5 is lower than that of the insulating film 2, part of the insulating film 2 which is positioned on the sidewalls and surrounded by the insulator 5 is not removed. This suppresses the formation of the depressions 22 encountered by the background art.

The suppression of the formation of the depressions 22 also prevents the active region 3 and the gate electrode interconnect line 4 from being closer to each other or short-circuited which has been the problem of the background art.

Further, since the thickness of the semiconductor film 7 is greater than that of the silicon oxide film 6, the vertical distance from the silicon oxide film 6 to the top of the insulator 5 is greater than the thickness of the silicon oxide film 6. This prevents the removal of the entire insulator 5 before the removal of the entire silicon oxide film 6 in the structure shown in FIGS. 10 and 11.

The second thermal oxidation performed on the structure shown in FIG. 5 allows oxidation to proceed rapidly at the interface between the silicon oxide film 6 and the semiconductor film 7 to form the insulator 5 having the cross-sectional configuration extending smoothly from the insulating film 2 toward the active region 3.

The processes for the second thermal oxidation shown in FIGS. 5 and 6 are of two types: a process for prolonged oxidation of the semiconductor substrate 1 placed in an electric furnace filled with an oxidizing atmosphere at temperatures above 1000° C.; and a process for instantaneous oxidation of the semiconductor substrate 1 in an oxidizing atmosphere using an instantaneous high-temperature heater such as a lamp annealing unit. The second thermal oxidation using the former process prevents abrupt development of stresses between the semiconductor substrate 1 and the insulator 5 which result from the thermal expansion of the semiconductor substrate 1, the insulating film 2, and the oxide region 5a, suppressing the generation of crystal defects and the like adjacent the semiconductor substrate 1 and the oxide region 5a. The second thermal oxidation using the latter process shortens the time permitted for oxidation proceeding at the interface between the silicon oxide film 6 and the semiconductor film 7, controlling the growth of the insulators 5 along the surface of the semiconductor substrate 1, that is, the bird's beak. Thus, the control of the growth of the bird's beak to decrease the length L1 of the insulator 5 along the surface of the semiconductor substrate 1 shown in FIG. 6 increases the area of the active region 3.

Figure 26:
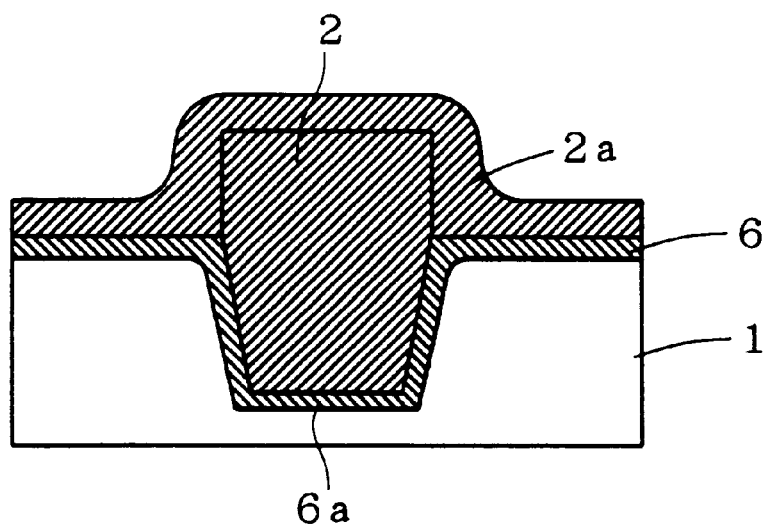
Figure 27:
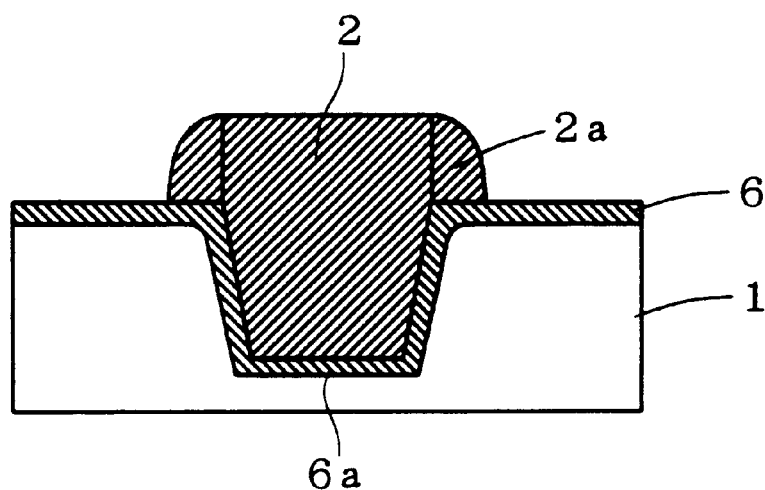
Figure 28:
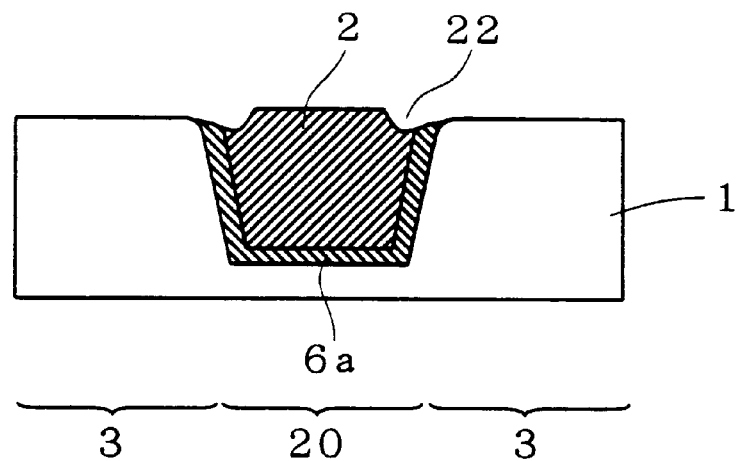

The background art fabrication method illustrated in FIGS. 26 and 27 uses anisotropic etching to leave the parts of the insulating film 2a as the sidewalls of the insulating film 2. The use of the anisotropic etching might cause foreign substances to be incorporated into the semiconductor substrate 1 through the thin silicon oxide film 6, and etch the surface of the semiconductor substrate 1, resulting in damages to the semiconductor substrate 1. On the other hand, the second preferred embodiment eliminates the need to use the anisotropic etching for formation of the insulator 5 serving as the sidewalls of the insulating film 2, as illustrated in FIGS. 6 through 11. Further, no anisotropic etching is required to etch the semiconductor film 7. Therefore, the second preferred embodiment prevents the above described damages to the semiconductor substrate 1.

Additionally, the top surface of the insulating film 2 raised above the surface of the active region is prevented from being etched to a level lower than the surface of the active region 3 if the structure shown in FIG. 11, for example, is etched.

Third Preferred Embodiment

In the first and second preferred embodiments, the insulator 5 covers the outer edges of the active region 3. Thus, the area of the active region 3 is reduced by the amount of the insulator 5. The area of the active region 3 may be increased by controlling the growth of the bird's beak using the process for oxidation for a relatively short time period by using the instantaneous high-temperature heater such as the lamp annealing unit as described in the second preferred embodiment. This process, however, might abruptly develop the stresses between the semiconductor substrate 1 and the insulators 5 since the semiconductor substrate 1 instantaneously reaches a high temperature.

To solve the above disadvantages, a third preferred embodiment of the present invention illustrates the method of fabricating the semiconductor device which is capable of controlling the growth of the bird's beak without the use of the process for oxidation for the relatively short time period which uses the instantaneous high-temperature heater such as the lamp annealing unit for the second thermal oxidation, with reference to FIGS. 12 through 19.

Figure 13:
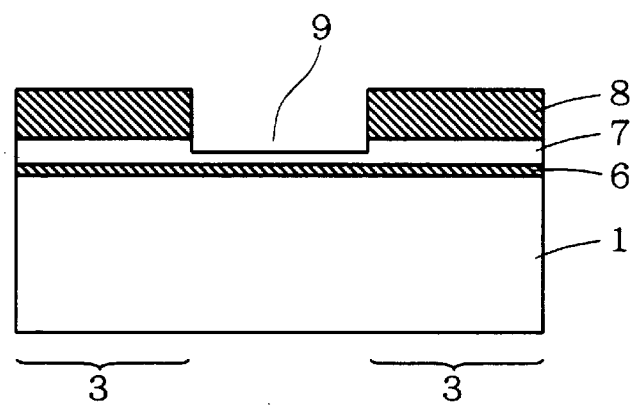
Figure 14:
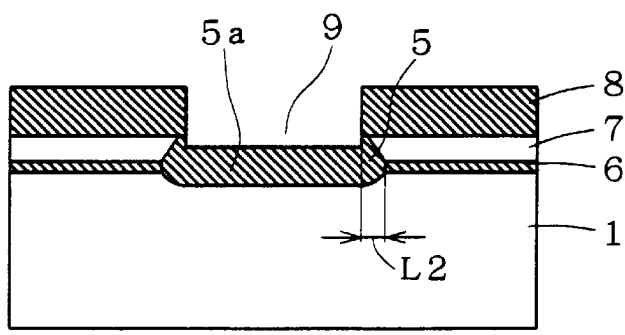
Figure 15:
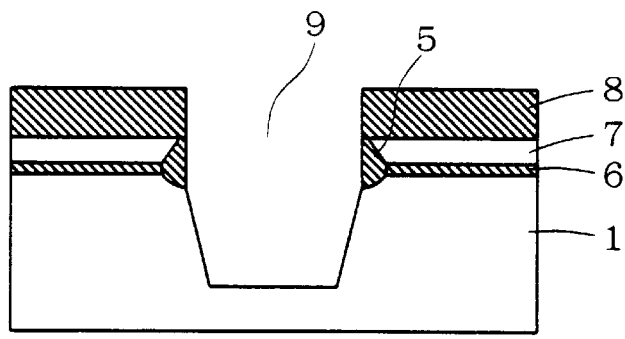
Figure 16:
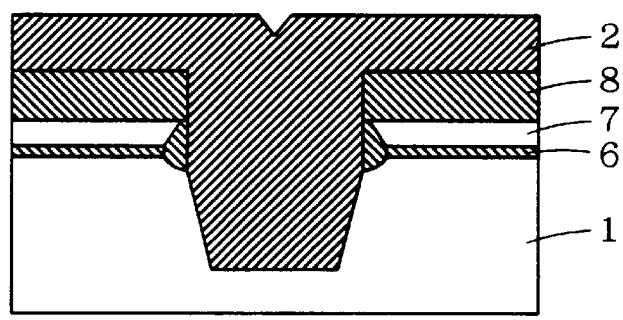
Figure 17:
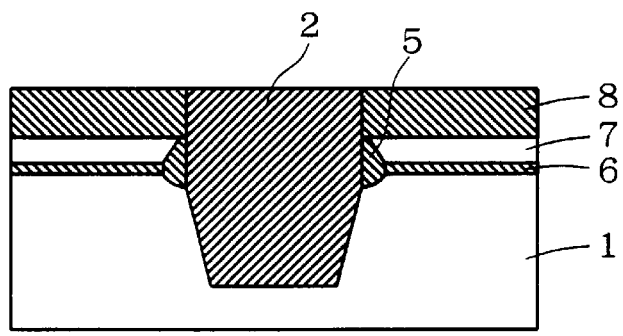
Figure 18:
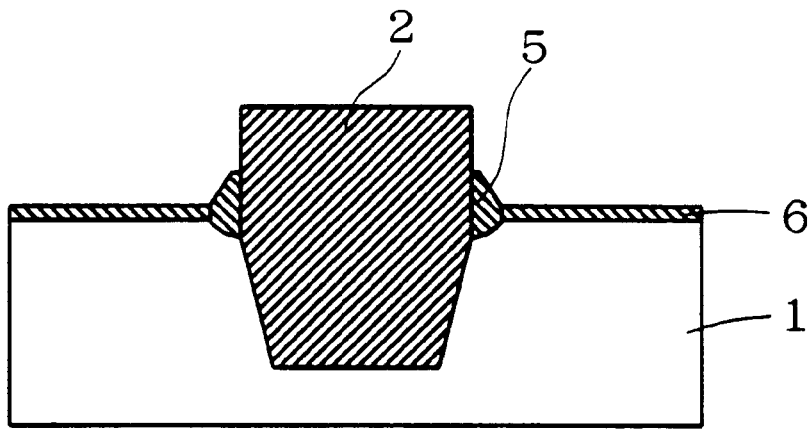
Figure 19:
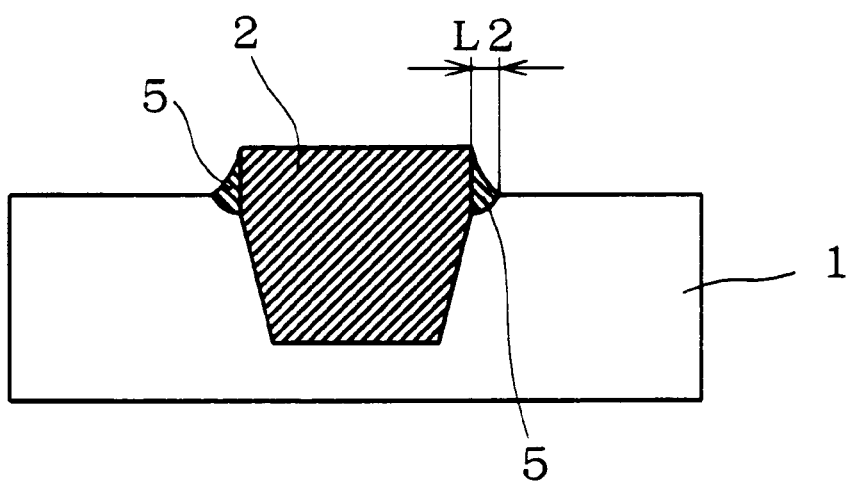
Figure 20:
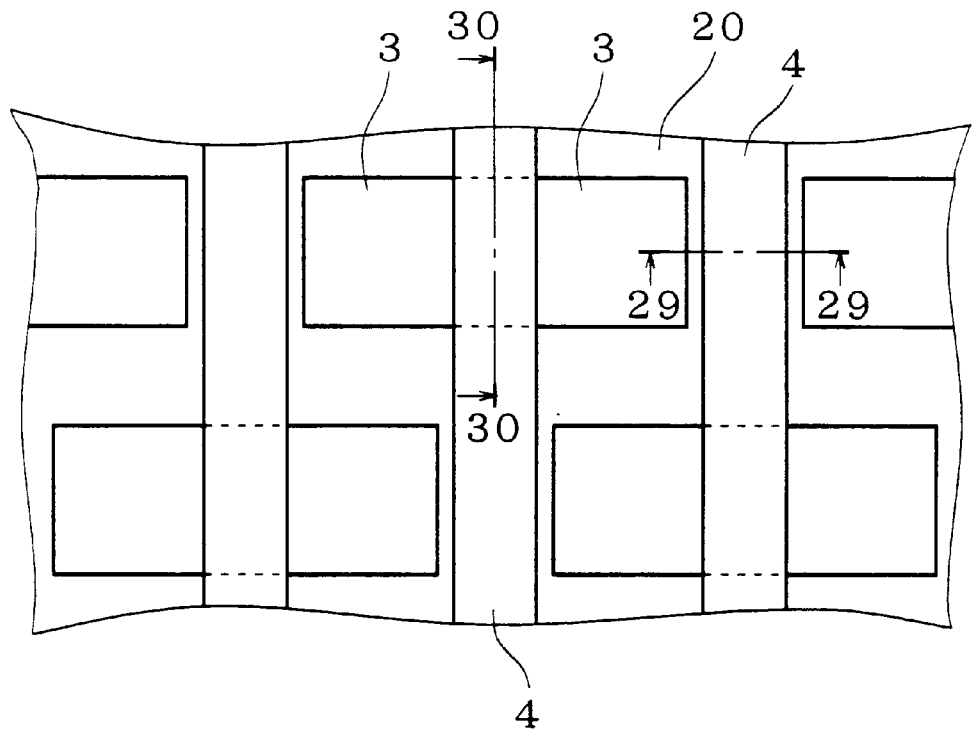
FIG. 20 is a plan view of a background art semiconductor device.
Figure 21:
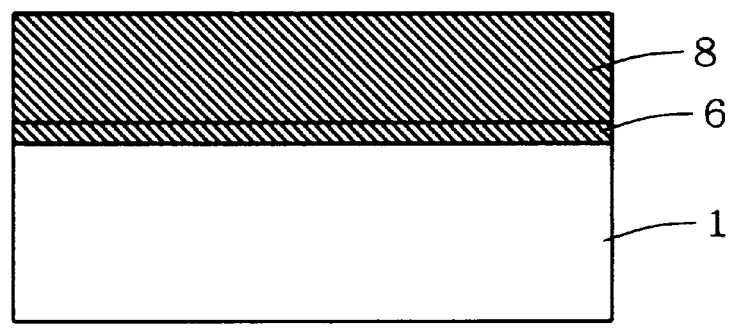
FIGS. 21 through 28 illustrate a method of fabricating the background art semiconductor device.
Figure 22:
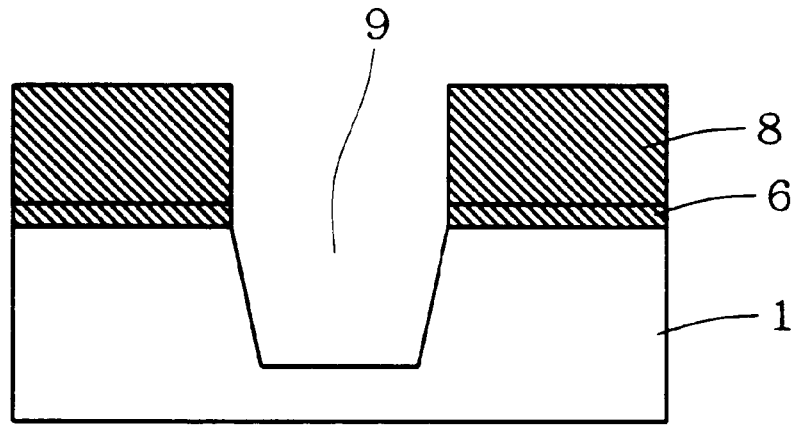
Figure 23:
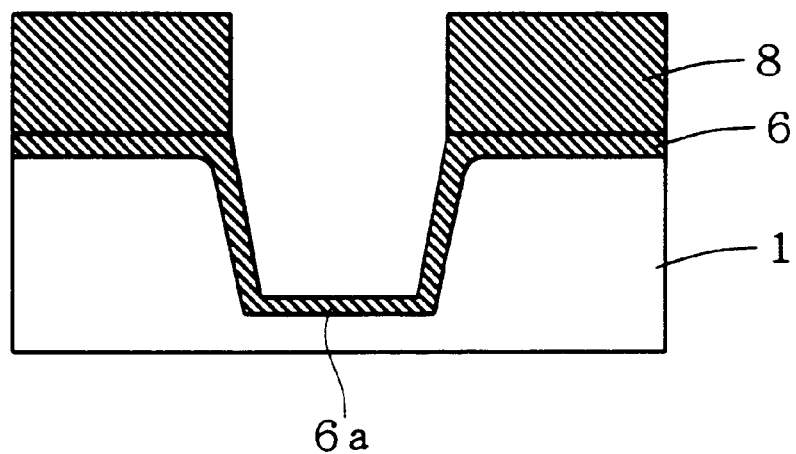
Figure 24:
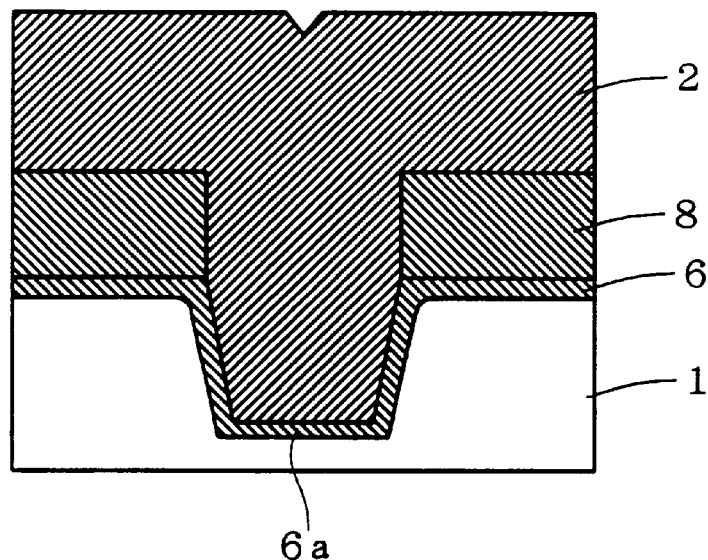
Figure 25:
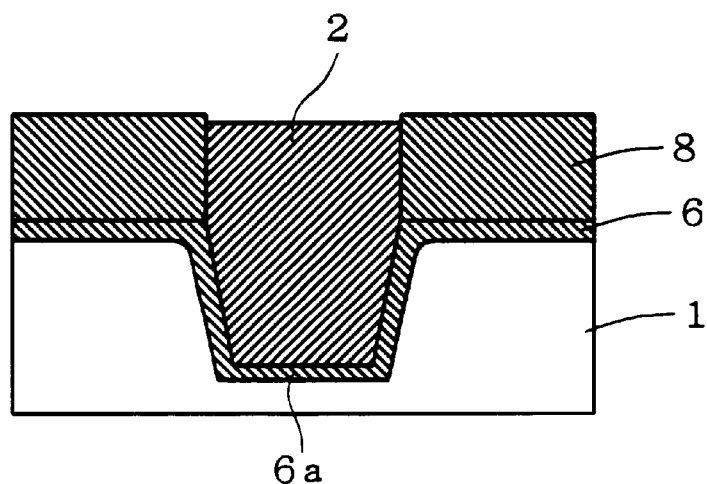

FIGS. 12 through 19 correspond to FIGS. 4 through 11, respectively. The method of fabricating the semiconductor device of the third preferred embodiment is mainly similar to that of the second preferred embodiment. The differences are described below. The trench 9 is anisotropically etched from the top surface of the structure shown in FIG. 12 toward the semiconductor substrate 1, like the second preferred embodiment. The etching of the trench 9 is temporarily stopped when the inside of the semiconductor film 7 is exposed (FIG. 13). Then, the second thermal oxidation is performed on the inner walls of the trench 9 so that part of the semiconductor film 7 which is exposed to the trench 9 and parts of the silicon oxide film 6 and semiconductor substrate 1 which are positioned immediately under the bottom of the trench 9 are oxidized to form the oxide region 5*a* (FIG. 14).

The length L2 of the bird's beak shown in FIG. 14 is shorter than the length L1 shown in FIG. 6 for the reason to be described below. Oxidation is not caused without the supply of an oxidizing species. In the course of the formation of the oxide region Sa, the part of the semiconductor film 7 which is positioned immediately under the bottom of the trench 9 is first oxidized to form part of the oxide region 5*a*. Thus, it takes time for the oxidizing species to reach the silicon oxide film 6. This precludes the oxidation from proceeding along the interface between the silicon oxide film 6 and the semiconductor film 7 to delay the growth of the bird's beak.

The third preferred embodiment produces effects to be described below.

The thermal oxidation performed when the trench 9 is etched into the semiconductor film 7 may reduce the length of the bird's beak to increase the area of the active region 3 without the use of the instantaneous oxidation process using the instantaneous high-temperature heater such as the lamp annealing unit.

Variations

Although the second oxidation is performed when the trench 9 is etched to the surface of the silicon oxide film 6 in the second preferred embodiment, the second oxidation may be performed after the trench 9 is etched to the top surface of the semiconductor film 7 as shown in FIG. 5 and immediately before the wet etching using hydrofluoric acid starts as illustrated in FIG. 11. For example, the oxide region 5*a* may be formed if the second thermal oxidation is performed when the trench 9 is etched to reach the semiconductor substrate 1 as shown in FIG. 7, when the insulating film 2 is deposited and formed over the top surface of the structure shown in FIG. 7 by the CVD process as shown in FIG. 8, or when the part of the insulating film 2 which is above the surface of the silicon nitride film 8 is removed as shown in FIG. 9.

Further, the second thermal oxidation divided into a plurality of thermal oxidation processes may be performed. For example, the thickness of the oxide region 5*a* may be further increased by 5 to 50 nm by performing the thermal oxidation when the trench 9 is etched to the surface of the silicon oxide film 6 as described in the second preferred embodiment and then further performing the thermal oxidation when the trench 9 is etched to the depth shown in FIG. 7.

While the invention has been described in detail, the foregoing description is in all aspects illustrative and not restrictive. It is understood that numerous other modifications and variations can be devised without departing from the scope of the invention.

We claim:

1. A method of fabricating a semiconductor device, comprising the steps of:

(a) etching a trench extending from a surface of a semiconductor substrate and having a bottom in said semiconductor substrate to define an active region;

(b) forming an insulator at an outer edge of said active region, said insulator protruding upwardly above the surface of said semiconductor substrate to extend part of an inner wall of said trench upwardly;

(c) forming an insulating film over a top surface of a structure in which said trench is etched so as to fill at least said trench and protrude from said trench; and (d) etching away a top part of said insulating film after said step (b), wherein the etching rate of said insulator is lower than that of said insulating film in said step (d).

2. The method according to claim 1, wherein said step (a) comprises the steps of:

(a-1) forming a first oxide film on the surface of said semiconductor substrate by first thermal oxidation;

(a-2) forming a semiconductor film on said first oxide film; and (a-3) forming a nitride film on said semiconductor film, said steps (a-1), (a-2), and (a-3) being performed before said trench is etched, wherein said step (b) comprises the step of:

(b-1) performing second thermal oxidation after said trench is etched to a top surface of said semiconductor film, to form an oxide region thicker than said first oxide film, wherein said step (c) comprises the steps of:

(c-1) depositing and forming a second oxide film serving as said insulating film over the top surface of the structure in which said trench is etched;

(c-2) removing part of said insulating film which is above a top surface of said nitride film; and (c-3) removing said nitride film and said semiconductor film, and wherein said oxide region includes said insulator.

3. The method according to claim 2, wherein said second thermal oxidation is performed when said trench is etched into said semiconductor film.

4. The method according to claim 2, wherein the thickness of said semiconductor film is greater than the thickness of said first oxide film.

* * * * *